(12) United States Patent
Brelsford et al.

(10) Patent No.: US 8,091,055 B2
(45) Date of Patent: Jan. 3, 2012

(54) METHOD AND APPARATUS FOR MANAGING VIOLATIONS AND ERROR CLASSIFICATIONS DURING PHYSICAL VERIFICATION

(75) Inventors: Kevin Brelsford, Bedford, NH (US); Keith Rast, Yacolt, WA (US); William Christopher Dunn, Raleigh, NC (US); Jason Richard Puryear, Cary, NC (US)

(73) Assignee: Synopsys, Inc., Mountain View, CA (US)

( * ) Notice: Subject to any disclaimer, the term of this patent is extended or adjusted under 35 U.S.C. 154(b) by 400 days.

(21) Appl. No.: 12/359,676

(22) Filed: Jan. 26, 2009

(65) Prior Publication Data

US 2010/0192113 A1 Jul. 29, 2010

(51) Int. Cl.
*G06F 9/455* (2006.01)
*G06F 17/50* (2006.01)

(52) U.S. Cl. ........ 716/111; 716/106; 716/107; 716/112; 716/118; 716/119; 716/139; 707/758; 707/781; 707/785; 707/802; 707/803; 707/804

(58) Field of Classification Search .......... 716/106–107, 716/111–112, 118–119, 139; 707/758, 781, 707/785, 802–804
See application file for complete search history.

(56) References Cited

U.S. PATENT DOCUMENTS

| | | | | |
|---|---|---|---|---|
| 6,009,251 A * | 12/1999 | Ho et al. | | 716/102 |
| 6,418,551 B1 | 7/2002 | McKay | | |
| 6,676,023 B2 * | 1/2004 | Shinoda | | 235/492 |
| 7,207,016 B2 * | 4/2007 | Meyer et al. | | 716/112 |
| 7,716,613 B2 * | 5/2010 | Meyer et al. | | 716/136 |

* cited by examiner

*Primary Examiner* — Nghia Doan
(74) *Attorney, Agent, or Firm* — Park, Vaughan, Fleming & Dowler LLP; Laxman Sahasrabuddhe

(57) ABSTRACT

Some embodiments provide a system for managing violations during physical verification. The system may identify a design-rule-check (DRC) violation by applying a set of DRC rules to a layout. The system can then receive an error classification from the user which specifies how the DRC violation is to be handled. Next, the system can store the DRC violation, the user-selected error classification, and a user identifier associated with the user in a database. If the user is not authorized to approve the error classification, the database can indicate that the error classification has not been approved. Later, a user who is authorized to approve the error classification can approve the error classification. The system can determine if a cell is known, and if so, the system can use the violations and error classifications stored in the database to speed up the verification process.

15 Claims, 6 Drawing Sheets

METHOD AND APPARATUS FOR MANAGING VIOLATIONS AND ERROR CLASSIFICATIONS DURING PHYSICAL VERIFICATION

BACKGROUND

1. Field

This disclosure generally relates to electronic design automation. More specifically, the disclosure relates to methods and apparatuses for managing violations and error classifications during physical verification.

2. Related Art

Rapid advances in computing technology have been made possible by sophisticated verification tools which are used to verify a circuit design. Indeed, without these tools it would be almost impossible to verify complicated integrated circuits which are commonly found in today's computing devices.

To reduce design time, it is usually desirable to accurately identify errors as early as possible in the design flow. If an error is identified at a later stage, it can substantially increase the design time because a number of stages in the design flow will most likely have to be repeated for the debugged design.

Physical verification is an important stage in the design flow. In this stage, the circuit can be checked to ensure correctness for manufacturing, electrical issues, lithographic issues, etc. A physical verification tool typically identifies locations in a layout which are likely to result in manufacturing problems. The circuit designer can use this information to modify the layout so that when the circuit is taped-out, the circuit is free of manufacturing problems.

Unfortunately, conventional physical verification tools can make it very difficult to separate real errors from intended violations, especially when the tool generates a large number of violations. As a result, in conventional techniques, even after the circuit passes the physical verification stage, the circuit may still have manufacturing problems.

SUMMARY

Some embodiments of the present invention provide systems and techniques for managing violations and error classifications during physical verification. Specifically, some embodiments substantially increase the probability of catching all errors during the physical verification stage.

During operation, the system may identify a design-rule-check (DRC) violation by applying a set of DRC rules to a layout. Next, the system may present the DRC violation to a user. Specifically, the system may display the violation to the user using a graphical user interface (GUI). The system can then receive an error classification from the user, wherein the error classification specifies how the DRC violation is to be handled. Specifically, an error classification can indicate whether the DRC violation is to be waived, watched, etc. The user may select an error classification for the DRC violation using a drop-down menu or by checking a checkbox. Note that the user may or may not be authorized to approve error classifications.

Next, the system can store the DRC violation, the user-selected error classification, and a user identifier associated with the user in a database. The database can associate the DRC violation with the error classification and the user identifier. Further, if the user is not authorized to approve the error classification, the database can indicate that the error classification has not been approved.

In some embodiments, if the error classification has not been approved, the system can present the DRC violation, the error classification, and the user identifier to a user who is authorized to approve error classifications. Next, the system may receive input from the user who is authorized to approve error classifications which indicates that the user approves the error classification. The system may then modify the database so that the database indicates that the error classification has been approved.

In some embodiments, the system uses the database to determine error classifications associated with a DRC violation. Specifically, the system can identify another DRC violation by applying the set of DRC rules to the layout. Next, the system can look-up an error classification in the database based on the DRC violation.

Note that looking-up an error classification in the database can involve comparing the given DRC violation with a DRC violation stored in the database. Specifically, the system may determine that two DRC violations match each other if (1) the violation identifiers match, (2) the cell names associated with the violations match, and (3) the shapes associated with the violations match (note that a shape can include one or more polygons).

Before handling a DRC violation according to the associated error classification, the system can determine whether the error classification has been approved. If the error classification has been approved, the system can handle the DRC violation according to the error classification. On the other hand, if the error classification has not been approved, the system can handle the DRC violation in a default manner.

In some embodiments, the system can enable a user to generate reports based on the error classifications. Specifically, in some embodiments, the system can generate a report which identifies DRC violations which are associated with error classifications which have not been approved.

In some embodiments, the system can speed up the process of applying a set of DRC rules to a layout by associating DRC violations and error classifications with a cell. Specifically, the system can receive a cell in a layout which needs to be verified using a set of DRC rules. Next, the system can look-up the cell in a database to determine whether the cell is associated with DRC violations and error classifications. If the look-up operation is successful, the system can then use the stored DRC violations and the error classifications instead of applying the set of DRC rules to the cell.

Note that looking-up the cell in the database can involve determining whether one cell matches another cell. Two cells can be considered to match each other if each edge in the first cell has a corresponding edge in the second cell. In some embodiments, the system may match two cells by trying to match each edge in the first cell with an edge in the second cell. Alternatively, the system can determine whether two cells match each other by comparing their checksums. Specifically, the system can compute a checksum for a cell by applying a checksum function to data associated with the cell. Next, the system can compare the checksums of two cells to determine whether the two cells match each other or not. For example, the system can store the cell's name, the cell's checksum, the DRC violations associated with the cell, and the error classifications associated with the DRC violations in a database. Next, when the system wants to determine whether a given cell is present in the database, the system can use the cell's name and/or the cell's checksum as the key to look-up violations and error classifications which are associated with the cell.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
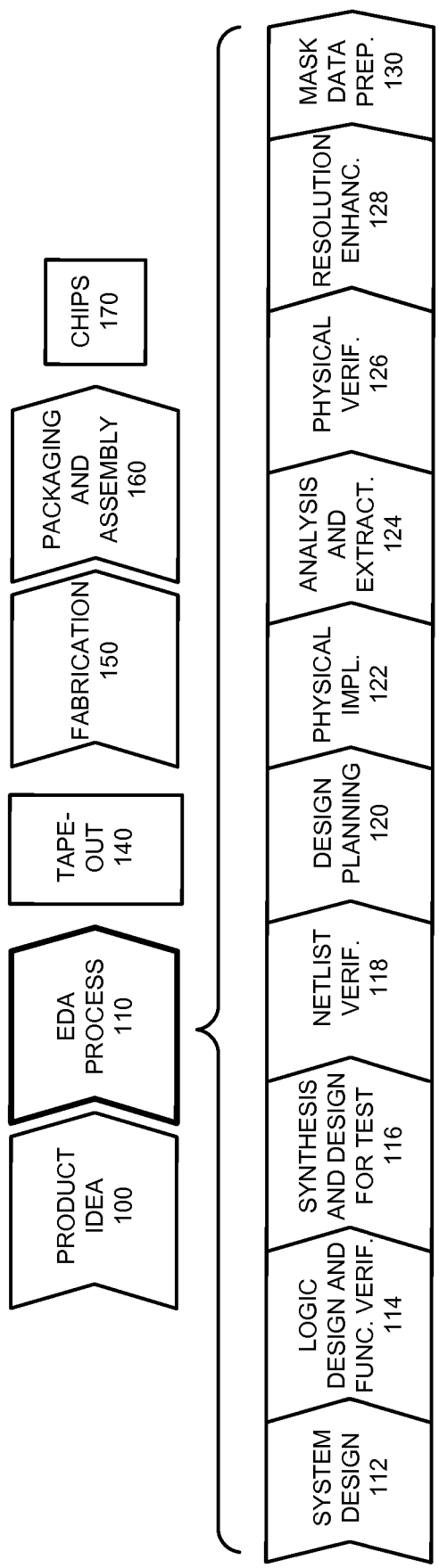
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Some embodiments can be used during one or more of the above-described steps. Specifically, some embodiments can be used during physical verification (step 126).

Design Rule Check (DRC)

The geometrical properties of a pattern typically dictate whether the pattern will result in features that have the desired shapes and/or sizes. A design rule usually specifies the geometrical properties and/or relationships that must be satisfied to ensure that the resulting features on the wafer have the desired shapes and/or sizes. Specifically, if a layout violates one or more design rules, the layout is likely to result in a chip which does not work as intended. During the physical verification step, the system typically checks a circuit layout using a set of design rules to ensure that all parts of the layout conform to the design rules.

Figure 2:
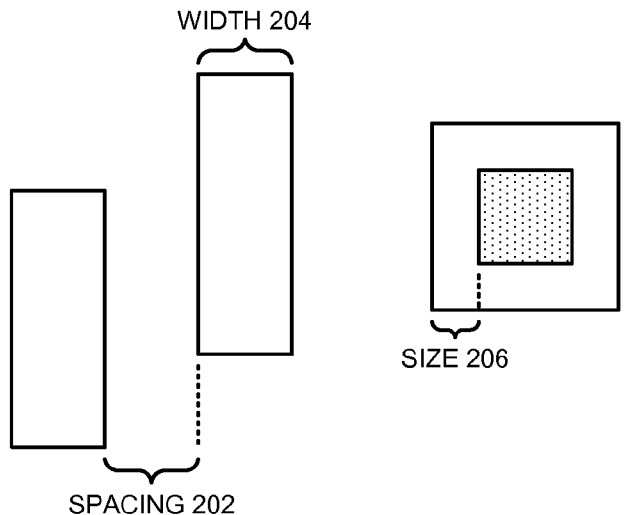
FIG. 2 illustrates commonly used parameters in a design rule in accordance with an embodiment of the present invention.

FIG. 2 illustrates commonly used parameters in a design rule in accordance with an embodiment of the present invention.

A design rule typically specifies acceptable ranges (e.g., lower and/or upper bounds) for one or more geometric parameters, which include, but are not limited to, area, grid, length, size, spacing, corner, enclosure, intersection, and overlap. For example, as shown in FIG. 2, a design rule may specify a minimum spacing 202 between polygons, a minimum width 204 of a polygon, and/or a minimum enclosure size 206. A design rule may be violated if the space between two polygons is less than the minimum spacing, the width of a polygon is less than the minimum width, and/or the enclosure is less than the minimum enclosure size. A violation of a design rule is usually called a DRC violation.

Sometimes a chip designer may want to intentionally violate one or more design rules to improve a chip's capacity and/or performance. For example, layouts for static random access memory (SRAM) can have highly repetitive patterns which may manufacture properly even if the patterns violate design rules. The system may enable a user to "waive" DRC violations so that the user can intentionally violate one or more design rules. Specifically, the system may first determine all DRC violations in a layout. Next, the system may filter out the DRC violations that have been waived, and report the remaining DRC violations.

Unfortunately, conventional approaches that enable a user to waive DRC violations suffer from serious drawbacks. Specifically, in conventional approaches, a user may mistakenly waive a DRC violation, or he/she may waive a DRC violation to avoid fixing the violation. In either case, the DRC violation may remain undiscovered until it is too late. Hence, it is generally desirable to manage DRC violations to ensure that all violations that need to be fixed are fixed.

In contrast to conventional approaches, some embodiments of the present invention enable a user to manage violations based on their error classification. For example, some embodiments can enable a user to ensure that a violation is waived only if there is a legitimate reason to waive the violation. Multiple error classifications can be defined for violations to enable a user to specify how the system should handle a violation. For example, an embodiment can require that a waiver be approved by an authorized user (e.g., a project manager) before the waiver can be used to waive a violation. Further, some embodiments can speed up the physical verification process by first determining whether the violations and the associated error classifications for a cell are already known. If the violations and the associated error classifications are already known, the system can directly use them. In this manner, the system can speed up physical verification by skipping a full-blown design rule check on the cell.

Error Classification

Some embodiments classify errors into different error classifications. Violations in each error classification are handled in a particular manner. Users can specify how a violation is to be handled by associating the violation with an appropriate error classification. Specifically, the system can use the following error classifications: "ignore," "waive," "watch," "unmatched waivers," "recommended," and "error." Note that these error classifications have been presented for illustration purposes only, and are not intended to limit the present invention. Specifically, some embodiments can allow a user to create custom error classifications.

During operation, the system can identify a violation by applying design rules to a layout. Next, the system can determine if the violation is associated with an error classification by looking-up the violation in an error classification database. If the system finds an associated error classification, the system can handle the violation accordingly; otherwise, the system can handle the violation in a default manner, e.g., the system can associate the violation with a default error classification.

Note that the system may enable the user to select which sets of error classifications to use. Specifically, the database may store multiple sets of error classifications which can be applied to the same set of violations. For example, a set of error classifications may be designed to maximize yield, whereas another set of error classifications may be designed to maximize capacity and/or performance. In some embodiments, the system may enable a user to select the sets of error classifications by using a GUI. For example, the system may present the sets of error classification to the user as a list, and may enable the user to select the sets of error classifications by using a pointer.

For violations associated with an error classification called "ignore," the system can ignore the violations, e.g., the system may not include the violations in any report. For example, benign violations and/or violations that are expected to be solved during a subsequent step in the design flow can be associated with this error classification.

In some embodiments, the system can include a DRC output violation database and an error classification database. By default, all the errors in the DRC output violation database can be of type "error." The error classification database, on the other hand, can be used to associate different types of error classifications with the DRC violations. For example, the error classification called "waive" can be associated with violations that were intended by a chip designer. Further, the "watch" error classification can be associated with violations which need to be fixed by the designer before the chip can be taped-out. The error classification "unmatched waivers" can be associated with waivers that exist in the error classification database but were not matched when a cell or layout was checked for design rule violations. If a violation is associated with the "recommended" error classification, it can indicate that the violation does not have to be fixed, but it is recommended that the violation be fixed to improve yield. As mentioned above, the error classification called "error" can be the default error classification, i.e., it is the error classification that is assigned to DRC violations which do not have an associated error classification in the error classification database.

Some embodiments can use multiple error classification databases in a single DRC job. Each error classification database can have access controls, which can be hierarchical in nature. Specifically, each error classification database can be controlled by a different group, e.g., CAD (computer-aided design) team, project leads, and individual users. As an exemplary embodiment, a system may include error classification databases that have three types of access controls: "user," "project," and "module." Error classification databases at the "user" level can be those that have been specified by a particular user. These error classification databases are applied only when that particular user is verifying the chip design, but they not applied when the chip design is being verified for tape-out. Error classification databases at the "project" level can be applied whenever any user performs physical verification of the chip, and these error classification databases are applied when the chip is taped-out. The "module" level can be the highest level of access control, and error classification databases at this level can be associated with a particular module (e.g., an SRAM module). Hence, if two different projects use the same module, the module level error classification databases would be applied in both projects.

The system may associate a set of violations and/or error classifications with a cell. If the system encounters the cell in the layout, the system can directly apply the violations and the associated error classifications to the cell instead of performing a design rule check on the cell. In this manner, the system can speed up the physical verification process.

In some embodiments, the system applies the stored violations and error classifications only if the cells match exactly. Specifically, two cells can be considered to match each other if each edge in the first cell has a corresponding edge in the second cell. If the cells don't match, the system may determine DRC violations by applying the design rules to the cell, and the system may associate the DRC violations with the default error classification.

Storing Error Classifications

Figure 3:
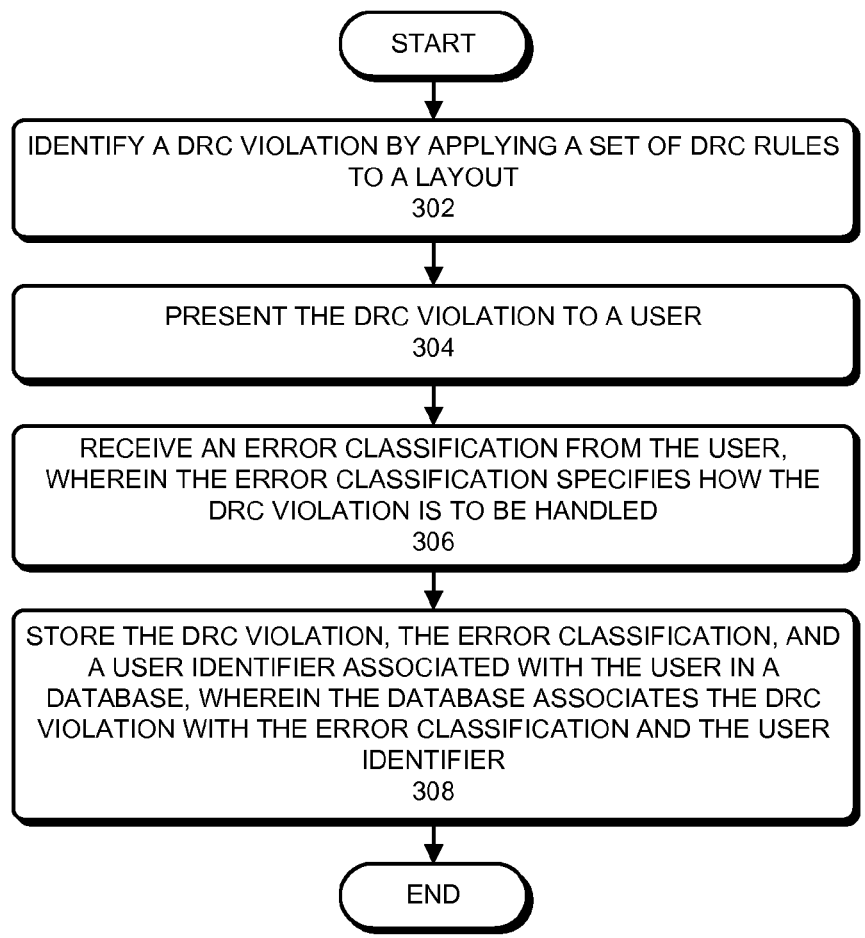
FIG. 3 presents a flowchart that illustrates a process for storing error classifications in accordance with an embodiment of the present invention.

FIG. 3 presents a flowchart that illustrates a process for storing error classifications in accordance with an embodiment of the present invention.

The process can begin by identifying a DRC violation by applying a set of DRC rules to a layout (step 302).

Next, the system can present the DRC violation to a user (step 304). Note that the user may or may not be authorized to approve error classifications.

The system can then receive an error classification from the user, wherein the error classification specifies how the DRC violation is to be handled (step 306).

Next, the system can store the DRC violation, the error classification, and a user identifier associated with the user in a database, wherein the database associates the DRC violation with the error classification and the user identifier (step 308). If the user is authorized to approve error classifications, the database may indicate that the error classification has been approved. On the other hand, if the user is not authorized to approve error classifications, the database may indicate that the error classification has not been approved. In addition, the database may also store a timestamp which indicates when a particular action (e.g., addition, deletion, modification, approval, etc.) on a database item (e.g., a DRC violation) was performed.

Approving Error Classifications

Figure 4:
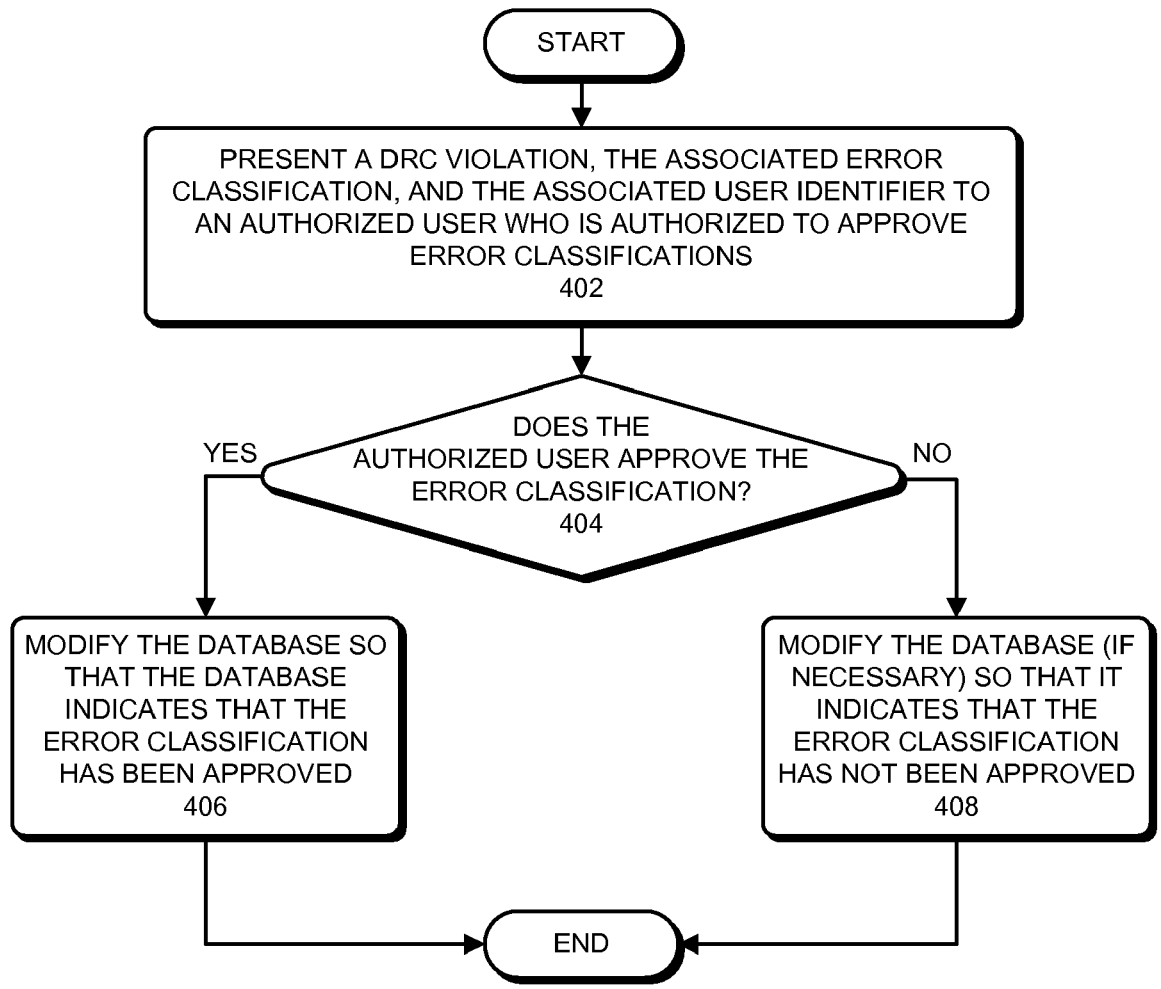
FIG. 4 presents a flowchart that illustrates a process for approving error classifications in accordance with an embodiment of the present invention.

FIG. 4 presents a flowchart that illustrates a process for approving error classifications in accordance with an embodiment of the present invention.

The process can begin by presenting a DRC violation, the associated error classification, and the associated user identifier to an authorized user who is authorized to approve error classifications (step 402).

Next, the system can receive input from the authorized user and determine if the input indicates that the authorized user approves the error classification (step 404).

If the input indicates that the authorized user approves the error classification, the system can modify the database so that the database indicates that the error classification has been approved (step 406).

On the other hand, if the input indicates that the authorized user does not approve the error classification, the system can modify the database (if necessary) so that it indicates that the error classification has not been approved (step 408).

Specifically, the system can decide not to modify the database if the database already indicates that the error classification has not been approved. In a variation, the system can modify the database so that it specifically indicates that the approval request for the error classification was denied.

In some embodiments, the approval process may be linked to the error classification's level. For example, a user may associate a particular error classification with a DRC violation. At this stage, the error classification's level may be set at the lowest level, e.g., the "user" level. When a project manager approves the error classification, the system may raise the error classification's level to "project" level. Finally, if the error classification is going to be shipped with a "soft IP" product, the error classification may undergo yet another approval process to elevate its level to the "technology" level.

Applying Error Classifications by Matching Violations

Figure 5:
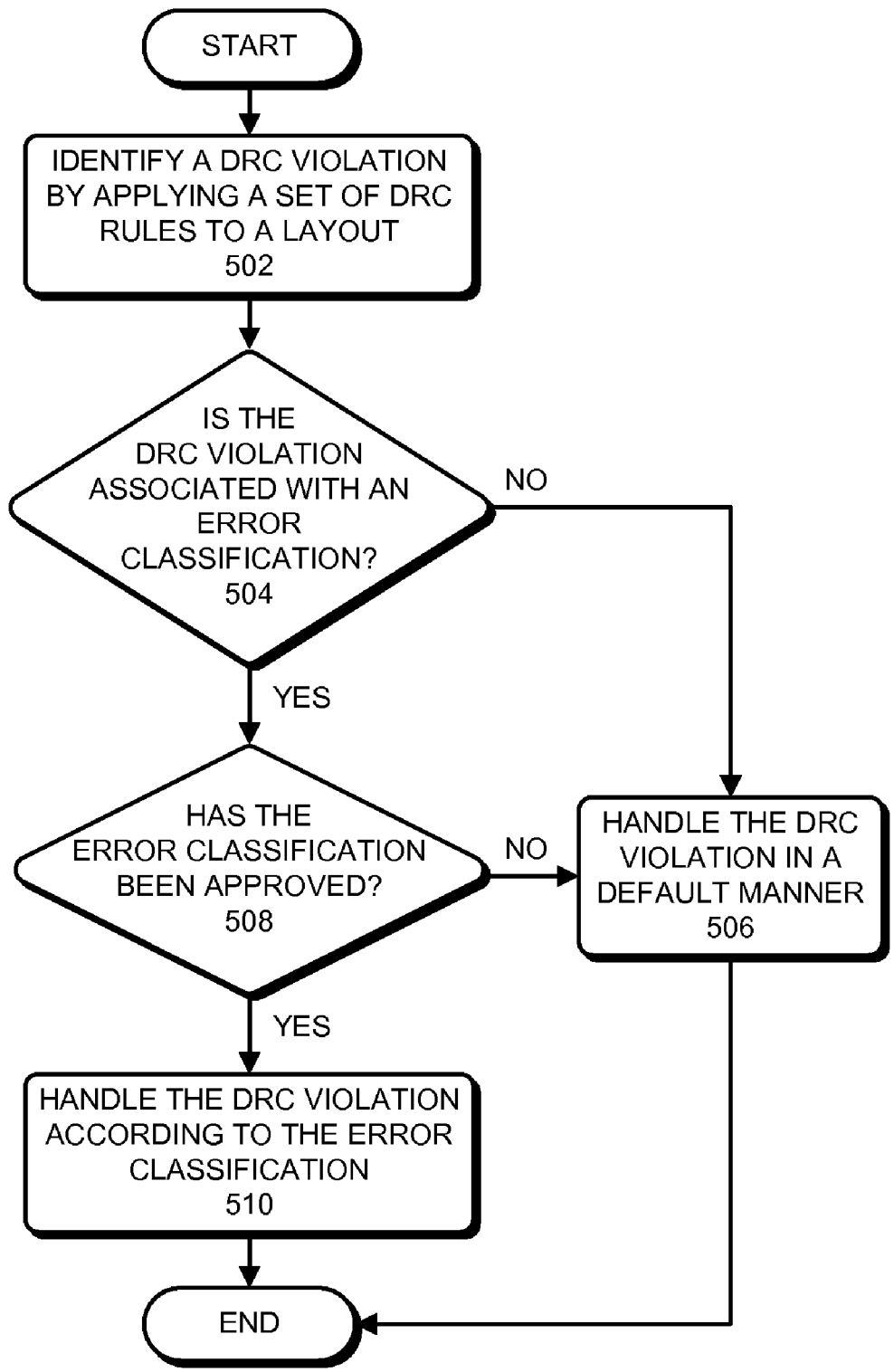
FIG. 5 presents a flowchart that illustrates a process for applying stored error classifications to violations in accordance with an embodiment of the present invention.

FIG. 5 presents a flowchart that illustrates a process for applying stored error classifications to violations in accordance with an embodiment of the present invention.

The process can begin by identifying a DRC violation by applying a set of DRC rules to a layout (step 502).

Next, the system can determine whether the DRC violation is associated with an error classification by looking-up the DRC violation in an error classification database (step 504).

Looking-up the DRC violation in the error classification database can involve comparing DRC violations. In some embodiments, the system concludes that two DRC violations match if: (1) the DRC violation identifiers match, (2) the cells associated with the DRC violations match, and (3) the shapes in the cells that are associated with the DRC violations also match.

If the DRC violation is not associated with an error classification, the system can handle the DRC violation in a default manner (step 506). On the other hand, if the DRC violation is associated with an error classification, the system can then determine whether the error classification has been approved (step 508).

If the error classification has been approved, the system can handle the DRC violation according to the error classification (step 510). On the other hand, if the error classification has not been approved, the system can handle the DRC violation in a default manner (step 506). In a variation, if the error classification has not been approved, the system can report the error classification and the associated DRC violation to a user.

Applying Error Classifications by Matching Cells

Figure 6:
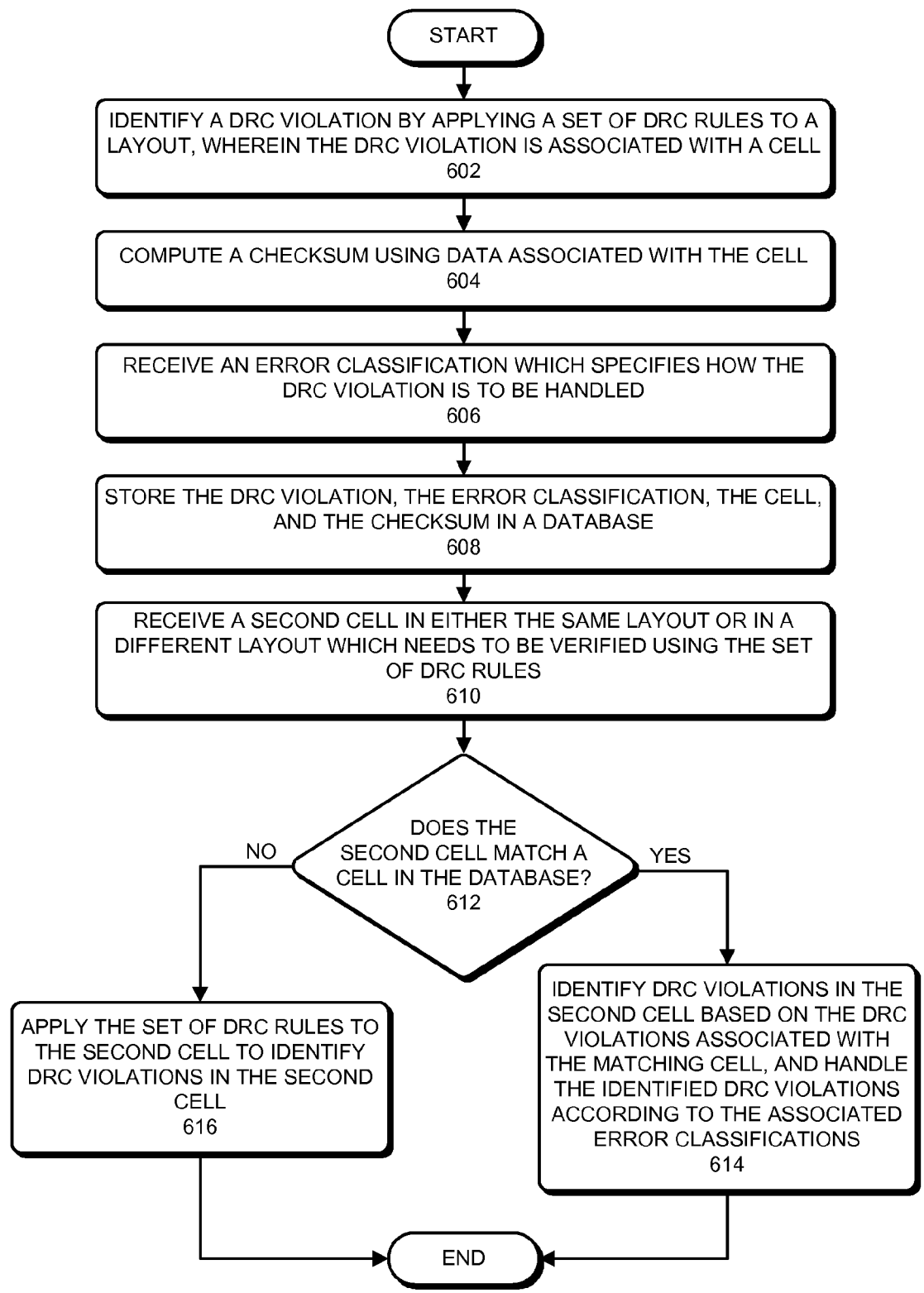
FIG. 6 presents a flowchart that illustrates a process for applying stored error classifications based on cell matching in accordance with an embodiment of the present invention.

FIG. 6 presents a flowchart that illustrates a process for applying stored error classifications based on cell matching in accordance with an embodiment of the present invention.

The process can begin by identifying a DRC violation by applying a set of DRC rules to a layout, wherein the DRC violation is associated with a cell in the layout (step 602).

Next, the system can compute a checksum using data associated with the cell (step 604). For example, the system can compute a checksum by applying a checksum function to the data that describes the polygons in the cell.

The system can then receive an error classification which specifies how the DRC violation is to be handled (step 606).

Next, the system can store the DRC violation, the error classification, the cell, and the checksum in a database (step 608). Specifically, the database can associate the DRC violation with the error classification, the cell, and the checksum. Note that the database can "store" the cell by storing a cell identifier associated with the cell.

The system can then receive a second cell in either the same layout or in a different layout which needs to be verified using the set of DRC rules (step 610).

Next, the system can determine if the second cell matches a cell in the database (step 612). Specifically, the system can compute a checksum for the second cell. Next, the system can look-up the checksum in the database to determine a stored cell that matches the second cell.

If the second cell matches a stored cell, the system can identify DRC violations in the second cell based on the DRC violations associated with the matching cell, and handle the identified DRC violations according to the associated error classifications (step 614). In some embodiments, if the second cell matches a stored cell, the system may decide not to check the second cell.

On the other hand, if the second cell does not match any stored cell, the system can apply the set of DRC rules to the second cell to identify DRC violations in the second cell (step 616).

Figure 7:
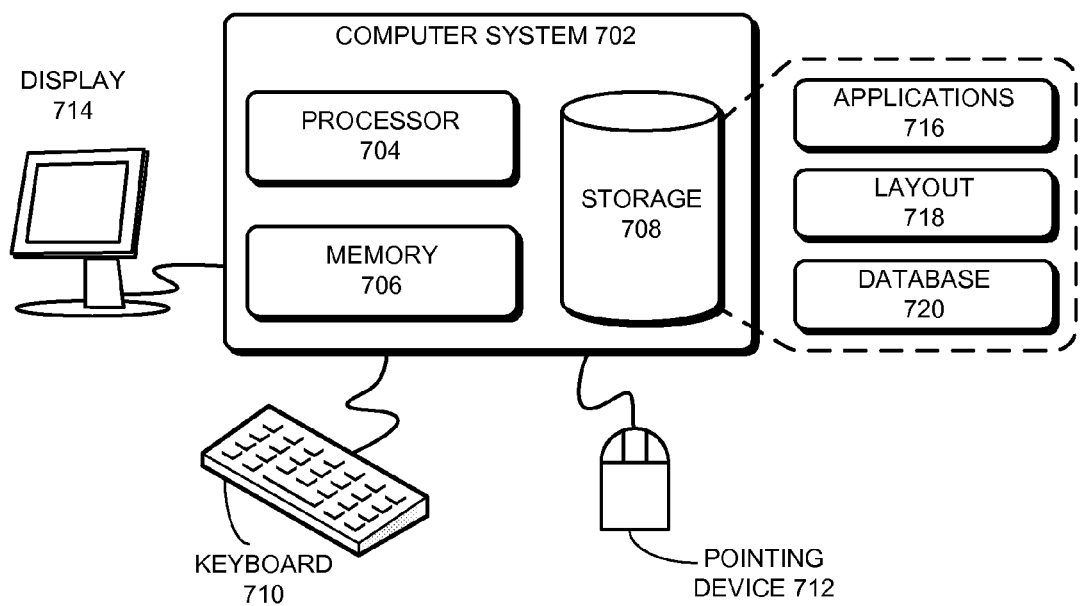
FIG. 7 illustrates a computer system in accordance with an embodiment of the present invention.

FIG. 7 illustrates a computer system in accordance with an embodiment of the present invention.

Computer system 702 comprises processor 704, memory 706, and storage 708. Computer system 702 can be coupled with display 714, keyboard 710, and pointing device 712. Storage 708 can store applications 716, layout 718, and database 720. Applications 716 can include instructions that when executed by processor 704 cause computer system 702 to perform one or more methods described in this disclosure. Specifically, applications 716 can include a DRC tool which can be used to identify DRC violations in layout 718, and to handle the DRC violations according to error classifications that are stored in database 720.

CONCLUSION

The data structures and code described in this detailed description are typically stored on a computer-readable storage device, which can be any device that can store code and/or data for use by a computer system. The computer-readable storage device includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage device as described above. When a computer system reads and executes the code and/or data stored on the computer-readable storage device, the computer system performs the methods and processes embodied as data structures and code and stored within the computer-readable storage device.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-executed method to manage violations during physical verification, the method comprising:
   identifying, by computer, a first design-rule-check (DRC) violation by applying a set of DRC rules to a layout;
   presenting the first DRC-violation to a first user;
   receiving a first error-classification from the first user, wherein the first error-classification specifies how the first DRC-violation is to be handled, and wherein the first user is not authorized to approve error classifications;
   storing, in a database, the first DRC-violation, the first error-classification, and a user identifier associated with the first user, wherein the database associates the first DRC-violation with the first error-classification and the user identifier, and wherein the database indicates that the first error-classification has not been approved;
   presenting the first DRC-violation, the first error-classification, and the user identifier to a second user who is authorized to approve error classifications; and
   in response to receiving input from the second user which indicates that the second user approves the first error-classification, modifying the database so that the database indicates that the first error-classification has been approved.

2. The computer-executed method of claim 1, comprising:
   identifying a second DRC-violation by applying the set of DRC rules to the layout;
   looking-up a second error-classification in the database based on the second DRC-violation;
   determining whether the second error-classification has been approved; and
   if so, handling the second DRC-violation according to the second error-classification;
   otherwise, handling the second DRC-violation in a default manner.

3. The computer-executed method of claim 2, further comprising generating a report which identifies DRC violations which are associated with error classifications which have not been approved.

4. The computer-executed method of claim 2, wherein looking-up a second error-classification in the database includes comparing the second DRC-violation with a third DRC-violation stored in the database, wherein the second DRC-violation is associated with a second shape in a second cell, wherein the third DRC-violation is associated with a third shape in a third cell, and wherein comparing the second DRC-violation with the third DRC-violation includes:
   comparing the second DRC-violation's identifier with the third DRC-violation's identifier;
   comparing the second cell's name with the third cell's name; and
   comparing the second shape with the third shape.

5. The computer-executed method of claim 1, wherein the error classification indicates whether the first DRC-violation should be waived.

6. A computer-readable storage device storing instructions that when executed by a computer cause the computer to perform a method to manage violations during physical verification, the method comprising:
   identifying a first design-rule-check-violation by applying a set of design-rule-check (DRC) rules to a layout;
   presenting the first DRC-violation to a first user;
   receiving a first error-classification from the first user, wherein the first error-classification specifies how the first DRC-violation is to be handled, and wherein the first user is not authorized to approve error classifications;
   storing, in a database, the first DRC-violation, the first error-classification, and a user identifier associated with the first user, wherein the database associates the first DRC-violation with the first error-classification and the user identifier, and wherein the database indicates that the first error-classification has not been approved;
   presenting the first DRC-violation, the first error-classification, and the user identifier to a second user who is authorized to approve error classifications; and
   in response to receiving input from the second user which indicates that the second user approves the first error-classification, modifying the database so that the database indicates that the first error-classification has been approved.

7. The computer-readable storage device of claim 6, wherein the method comprises:
   identifying a second DRC-violation by applying the set of DRC rules to the layout;

looking-up a second error-classification in the database based on the second DRC-violation;
determining whether the second error-classification has been approved; and
if so, handling the second DRC-violation according to the second error-classification;
otherwise, handling the second DRC-violation in a default manner.

8. The computer-readable storage device of claim 7, wherein the method comprises generating a report which identifies DRC violations which are associated with error classifications which have not been approved.

9. The computer-readable storage device of claim 7, wherein looking-up a second error-classification in the database includes comparing the second DRC-violation with a third DRC-violation stored in the database, wherein the second DRC-violation is associated with a second shape in a second cell, wherein the third DRC-violation is associated with a third shape in a third cell, and wherein comparing the second DRC-violation with the third DRC-violation includes:
  comparing the second DRC-violation's identifier with the third DRC-violation's identifier;
  comparing the second cell's name with the third cell's name; and
  comparing the second shape with the third shape.

10. The computer-readable storage device of claim 6, wherein the error classification indicates whether the first DRC-violation should be waived.

11. A system, comprising:
  a processor; and
  a storage device storing instructions, the instructions comprising:
    instructions for identifying a first design-rule-check-violation by
    applying a set of design-rule-check (DRC) rules to a layout;
    instructions for presenting the first DRC-violation to a first user;
    instructions for receiving a first error-classification from the first user, wherein the first error-classification specifies how the first DRC-violation is to be handled, and wherein the first user is not authorized to approve error classifications;
    instructions for storing, in a database, the first DRC-violation, the first error-classification, and a user identifier associated with the first user, wherein the database associates the first DRC-violation with the first error-classification and the user identifier, and wherein the database indicates that the first error-classification has not been approved;
    instructions for presenting the first DRC-violation, the first error-classification, and the user identifier to a second user who is authorized to approve error classifications; and
    instructions for in response to receiving input from the second user which indicates that the second user approves the first error-classification, modifying the database so that the database indicates that the first error-classification has been approved.

12. The system of claim 11, wherein the instructions stored on the storage device further comprise:
  instructions for identifying a second DRC-violation by applying the set of DRC rules to the layout;
  instructions for looking-up a second error-classification in the database based on the second DRC-violation; and
  instructions for:
    determining whether the second error-classification has been approved, and
    if so, handling the second DRC-violation according to the second error-classification,
    otherwise, handling the second DRC-violation in a default manner.

13. The system of claim 12, wherein the instructions stored on the storage device further comprise instructions for generating a report which identifies DRC violations which are associated with error classifications which have not been approved.

14. The system of claim 12, wherein looking-up a second error-classification in the database includes comparing the second DRC-violation with a third DRC-violation stored in the database, wherein the second DRC-violation is associated with a second shape in a second cell, wherein the third DRC-violation is associated with a third shape in a third cell, and wherein comparing the second DRC-violation with the third DRC-violation includes:
  comparing the second DRC-violation's identifier with the third DRC-violation's identifier;
  comparing the second cell's name with the third cell's name; and
  comparing the second shape with the third shape.

15. The system of claim 11, wherein the error classification indicates whether the first DRC-violation should be waived.

* * * * *